Figure 1:
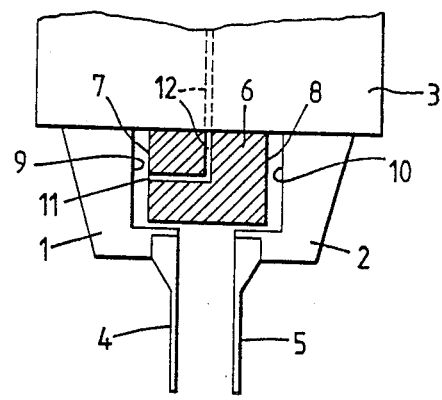

United States Patent [19]

van de Ven et al.

[11] Patent Number: 4,830,420

[45] Date of Patent: May 16, 1989

[54] GRIPPING DEVICE

[75] Inventors: Johannes T. A. van de Ven; Adrianus J. P. M. Vermeer, both of Eindhoven, Netherlands

[73] Assignee: U.S. Philips Corporation, New York, N.Y.

[21] Appl. No.: 153,102

[22] Filed: Feb. 8, 1988

[30] Foreign Application Priority Data

Mar. 30, 1987 [GB] United Kingdom ............... 8707564

[51] Int. Cl.$^4$ .............................................. B25J 19/02
[52] U.S. Cl. .................................. 294/86.4; 294/907; 901/46
[58] Field of Search ............... 294/1.1, 86.4, 88, 103.1, 294/104, 106, 119.1, 907; 901/30-39, 46, 50

[56] References Cited

U.S. PATENT DOCUMENTS

| 4,533,167 | 8/1985 | Johnson | 294/86.4 |
| 4,549,425 | 10/1985 | Wisebaker et al. | 901/34 X |

FOREIGN PATENT DOCUMENTS

| 633726 | 11/1978 | U.S.S.R. | 901/32 |
| 662344 | 5/1979 | U.S.S.R. | 294/86.4 |
| 1382444 | 1/1975 | United Kingdom . | |

OTHER PUBLICATIONS

IBM Technical Disclosure Bulletin, vol. 24, No. 10, Mar. 1982, "Combined Compliance Structure and Air Gauge Sensor" by Brennemann.

*Primary Examiner*—Johnny D. Cherry

[57] ABSTRACT

A gripping device for an apparatus for placing electronic and/or electrical components on a substrate comprises a pair of grippers (1 and 2) which are movable relative to one another by compressed-air or vacuum to close and open the jaws (4 and 5) of the grippers. For indicating the absence of a component between the gripper jaws when the jaws are closed, an orifice (1) is provided which communicates with a source of compressed air or vacuum at least during the closing movement of the jaws so that air flows through the orifice during this movement. If the jaws are closed to less than a predetermined distance between them which is equal to the width of the smallest component to be handled by the gripping device, the orifice is closed by one (1) of the grippers to interrupt the flow of air through the orifice. The orifice is formed in a body (6) which is fixed in relation to the movements of the grippers and which is formed on two opposite sides with abutment surfaces (7 and 8) which limit the closing movement of the grippers and in one (7) of which the orifice is formed.

2 Claims, 1 Drawing Sheet

GRIPPING DEVICE

DESCRIPTION

The invention relates to a gripping device for an apparatus for placing electronic and/or electrical components on a substrate, for example, a printed-circuit board. Such an apparatus is described in U.S. Pat. No. 4,664,591 which corresponds to European Patent Application No. 0 183 301. The invention relates particularly to a gripping device comprising a pair of grippers, each of which comprises a gripper jaw and at least one of which is movable relative to the other by air-pressure operated means to close and open the jaws for gripping and releasing a component. Compressed air or vacuum may be used to create an air-pressure differential for operating said means.

It is an object of the invention to provide a gripping device of the above kind which is equipped to give an indication of the absence of a component between the gripper jaws when the jaws are closed.

According to the invention a gripping device of the above kind is characterised in that the device comprises two cooperable parts of which a first part is movable with the movable gripper, or one of the grippers if both are movable, relative to the second part, one of said parts comprising an orifice which is arranged for communication with a source of compressed air or vacuum at least during the movement of the movable gripper, or the grippers if both are movable, in the closing direction so that air flows through said orifice during the closing of the gripper jaws, and the other part being arranged to close said orifice to interrupt the air flow in the event of the jaws being closed to less than a predetermined distance between the jaws, and means being provided which are responsive to such interruption and are operable thereupon to produce a signal for indicating said closure of the jaws.

The predetermined distance will be equal to the width of the components to be handled by the gripping device, or the width of the component of smallest width if components of different widths are to be handled. The width of a component is the distance between the two surfaces of the component that will be engaged by the gripper jaws.

The two cooperable parts in a gripping device according to the invention may comprise two cooperable surfaces arranged for abutment with one another to limit movement of the movable gripper, or one or each of the grippers if both are movable, in the closing direction, the orifice being formed in one of said surfaces so as to be closed by the other surface when the two surfaces abut one another.

In a preferred embodiment of the invention in which both grippers are movable, said one of the two cooperable parts comprises a first surface formed on a body which is fixed in relation to the movements of the grippers and said other part comprises a second surface formed on one of the grippers, the two surfaces being arranged for abutment with one another to limit movement of said one of the grippers in the closing direction and said orifice being formed in the first surface so as to be closed by the second surface when the two surfaces abut one another, and third and fourth surfaces are formed on the other gripper and said body, respectively, for abutment with one another to limit movement of said other gripper in the closing direction.

Figure 2:
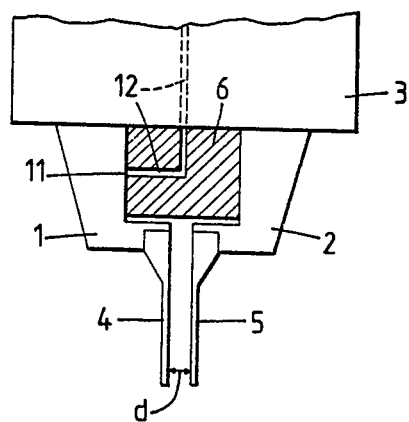

An embodiment of the invention will now be described with reference to the accompanying drawing, in which FIG. 1 is a side view, partly in section, of part of a gripping device according to the invention with the gripper jaws open, and FIG. 2 is a view similar to FIG. 1 but showing the gripper jaws closed without a component between them.

The gripping device shown in the drawing comprises a pair of grippers 1 and 2 supported in a mounting 3 which is adapted to be fitted in an apparatus for placing electronic and/or electrical components on a substrate, for example, an apparatus similar to that described in the aforementioned European Patent Application No. 0 183 301. The grippers 1 and 2 comprise jaws 4 and 5 for gripping a component (not shown) on two opposite sides thereof. Both grippers may be movably supported in the mounting 3 for translational movement towards and away from each other to close and open the jaws. Alternatively, one gripper may be fixed in the mounting 3 and the other movably supported for movement towards and away from the fixed gripper. It will be assumed in the present case that both grippers are movable. The movement of the grippers is effected by air-pressure operated means which may be of any convenient known form and therefore need not be illustrated or described in detail. They are accommodated in the mounting 3 and may comprise, for example, a single- or double-acting piston or pistons operated by compressed air or vacuum. In the case of a single-acting piston or pistons, each of the grippers 1 and 2 (or the movable gripper if only one is movable) is moved in one direction by compressed air or vacuum and in the opposite direction by a spring; with a double-acting piston or pistons each gripper (or the movable gripper) is moved in both directions by compressed air or vacuum.

Between the grippers 1 and 2 is a body 6 which is fixed to the mounting 3 and therefore is fixed in relation to the movements of the grippers. On two opposite sides the body 6 has surfaces 7 and 8 which serve as abutments for the grippers 1 and 2, respectively, to limit the closing movement of the grippers, the latter having surfaces 9 and 10, respectively, for cooperation with the abutment surfaces 7 and 8. When the grippers are in abutment with the surfaces 7 and 8, as shown in FIG. 2, the gripper jaws 3 and 4 are separated by a distance d which is less than the width of the components that the gripping device is required to handle. If the device is required to handle components of different widths, the distance d is less than the width of the component having the smallest width.

In one of the abutment surfaces 7 and 8, in this case the surface 7, is an orifice 11 which communicates by a duct 12 in the body 6 and the mounting 3 with a source of compressed air or vacuum, conveniently the source which supplies the compressed air or vacuum for operating the piston or pistons by which the grippers 1 and 2 are actuated. The orifice 11 can have a separate communication with this source, or, if the compressed air or vacuum acts to close the gripper jaws, the orifice can communicate with the source of compressed air or vacuum by the valve which controls the actuation of the grippers.

When the gripper jaws 4 and 5 are open, as shown in FIG. 1, air can flow through the orifice 11. If the orifice communicates with the source of compressed air or vacuum by the control valve for the actuation of the grippers, air will flow through the orifice 11 only during the closing of the jaws 4 and 5. If there is no component at the pick-up position, i.e., the position to which the components are fed to be picked up by the gripping device, the movement of the grippers 1 and 2 to close the jaws 4 and 5 will continue until the grippers abut the surfaces 7 and 8 of the body 6 with the result that the orifice 11 is closed by the surface 9 of the gripper 1 and the flow of air through the orifice thereby interrupted. Means which are responsive to this interruption of the air flow then produce a signal to indicate the absence of a component between the gripper jaws. These means, which are not shown in the drawings, may be of any convenient form. For example, they may comprise a sonic detection device similar to that described in U.S. Pat. No. 4,683,654 which corresponds to European Patent Application No. 0 091 720, modified so that the desired signal is produced as a result of the interruption of the air flow instead of the existence of the flow. If the air flow is produced by compressed air the means responsive to the interruption of the flow may alternatively comprise a pressure-operated device of known kind arranged to be actuated by the back pressure which is created in the duct 12 as a result of the closure of the orifice 11. When actuated the device produces, for example, an acoustic or visual signal. An advantage of the use of compressed air to produce the air flow is that any dust which may be in the vicinity of the orifice 11 will be blown away by the air flowing from the orifice.

Instead of limiting the closing movement of the grippers 1 and 2 by abutment surfaces on a body fixed to the mounting 3, namely the body 6 in the embodiment illustrated, cooperable abutment surfaces could be provided on the grippers themselves with the orifice 11 formed in one surface for closure by the other surface, particularly if one of the grippers is fixed and the other movable since the orifice could then conveniently be formed in the abutment surface on the fixed gripper. If the orifice were formed in an abutment surface on a movable gripper it would be necessary to provide a flexible hose for the communication between the orifice and the source of compressed air or vacuum.

What is claimed is:

1. A gripping device for an apparatus for placing components on a substrate, the device comprising a pair of grippers, each of which comprises a gripper jaw, at least one of which is movable relative to the other to close and open the jaws for gripping and releasing a component, said device comprising two cooperable parts of which a first part is movable with the movable gripper, one of said parts being fixed with respect to the grippers and having an orifice for communication with a source of compressed air at least during the movement of the movable gripper in the closing direction so that air can flow through said orifice during the closing of the gripper jaws, and the other part being arranged to close said orifice to interrupt air flow in the event of the jaws being closed to less than a predetermined distance between the jaws, said two cooperable parts comprising two cooperable surfaces arranged for abutment with one another to limit movement of the movable gripper in the closing direction, said orifice being formed in one of said surfaces so as to be closed by the other surface when the two surfaces abut one another.

2. A gripping device as claimed in claim 1 in which both grippers are movable and wherein said fixed part has another surface and the second movable gripper has a surface for abutting said other surface to limit movement of said second gripper in the closing direction.

* * * * *